(12) United States Patent
Chopin et al.

(10) Patent No.: US 8,853,867 B2
(45) Date of Patent: Oct. 7, 2014

(54) ENCAPSULANT FOR A SEMICONDUCTOR DEVICE

(71) Applicant: Freescale Semiconductor, Inc., Austin, TX (US)

(72) Inventors: Sheila F. Chopin, Round Rock, TX (US); Varughese Mathew, Austin, TX (US); Leo M. Higgins, III, Austin, TX (US); Chu-Chung Lee, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/170,067

(22) Filed: Jan. 31, 2014

(65) Prior Publication Data

US 2014/0145339 A1    May 29, 2014

Related U.S. Application Data

(63) Continuation of application No. 13/651,995, filed on Oct. 15, 2010, now abandoned.

(51) Int. Cl.
| | |
|---|---|
| H01L 23/532 | (2006.01) |
| H01L 23/48 | (2006.01) |
| H01L 23/29 | (2006.01) |
| H01L 23/28 | (2006.01) |

(52) U.S. Cl.
CPC .............. *H01L 23/295* (2013.01); *H01L 23/48* (2013.01); *H01L 23/28* (2013.01)
USPC ................... 257/787; 257/793; 257/E21.502

(58) Field of Classification Search
USPC ................... 257/787, 793, E21.502
See application file for complete search history.

(56) References Cited

U.S. PATENT DOCUMENTS

| | | | |
|---|---|---|---|
| 6,878,448 B2 | 4/2005 | Ishii et al. | |
| 7,977,412 B2 | 7/2011 | Mizuno | |
| 2007/0029682 A1* | 2/2007 | Aoki et al. | 257/793 |
| 2011/0104510 A1 | 5/2011 | Uno et al. | |
| 2011/0291260 A1 | 12/2011 | Honda et al. | |
| 2012/0001336 A1 | 1/2012 | Zeng et al. | |

OTHER PUBLICATIONS

Abe, Hidenori, "Molding Compounds for Cu Wire PKG", Hitachi Chemical, K&S Copper Summit Conference 2008, pp. 1-25.
Low et al., "Cu Wire Bonding for Fine Pitch 65nm Silicon Integrated Circuits", 2010 Electronic Components and Technology Conference, pp. 1154-1158, IEEE, US.
Uno, Tomohiro, "Bond Reliability Under Humid Environment for Coated Copper Wire", Microelectronics Reliability, 2010, doi:10.1016/j.microrel.2010.03.006.
Toagosei Co, Ltd., "Inorganic Ion Exchanger".
Sumitomo Bakelite Co, Ltd., "Investigation for Corrosion on a Die with Cu Metal Circuit", Mar. 10, 2006, pp. 1-18.

(Continued)

*Primary Examiner* — Roy Potter

(57) ABSTRACT

A mold compound is provided for encapsulating a semiconductor device (101). The mold compound comprises at least approximately 70% by weight silica fillers, at least approximately 10% by weight epoxy resin system, and beneficial ions that are beneficial with respect to copper ball bond corrosion. A total level of the beneficial ions in the mold compound is at least approximately 100 ppm.

20 Claims, 3 Drawing Sheets

(56) References Cited

OTHER PUBLICATIONS

Su, Peng, "An Evaluation of Effects of Molding Compound Properties on Reliability of Cu Wire Components", 2011 Electronic Components and Technology Conference, pp. 363-369, IEEE, US.

Mathew et al., "Copper Wirebond Compatibility with Organic and Inorganic Ions Present in Mold Compounds", 46th International Symposium on Microelectronics (IMAPS 2013), Sep. 30-Oct. 3, 2013, pp. 1-5, Orlando, FL, US.

* cited by examiner

ENCAPSULANT FOR A SEMICONDUCTOR DEVICE

CROSS-REFERENCE TO RELATED APPLICATIONS

This application is a continuation of prior U.S. application Ser. No. 13/651,995, filed Oct. 15, 2012, now abandoned. The entire disclosure of U.S. application Ser. No. 13/651,995 is hereby incorporated by reference herein.

BACKGROUND

1. Field

This invention relates generally to packaged semiconductor devices, and more specifically to a semiconductor device encapsulant that is compatible with copper wire bonding.

2. Related Art

Electronic devices such as semiconductor devices can be encapsulated in an encapsulant such as a mold compound. The concentrations of ions in a mold compound are typically determined via aqueous extraction under elevated temperature and pressure, and then analysis by a method such as ion chromatography. The mold compound must be finely ground (e.g., 100% of particles no greater than 10 μm) before the extraction in order to extract all of the ions from the mold compound, which is required to correctly determine the ion concentrations. One gram of finely ground cured mold compound is then added to ten milliliters of ultra-pure water and then mixed for approximately two hours. The mix is then sealed in a high purity bomb and heated to 120-190° C. for a time (e.g., 24 hours at 120° C.). The extract is then filtered and tested to determine the concentration of ionic species and the pH (e.g., using ion chromatography). The measured ionic concentrations in the sample are then translated for the bulk mold compound based on the amount of water that was used. The ionic concentrations, which are determined by the aqueous extraction and analysis (or another methodology), are then attributed to be the ionic concentrations in the cured bulk mold compound, and the pH of the aqueous extract is attributed to be the pH of the bulk mold compound due to absorbed water.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
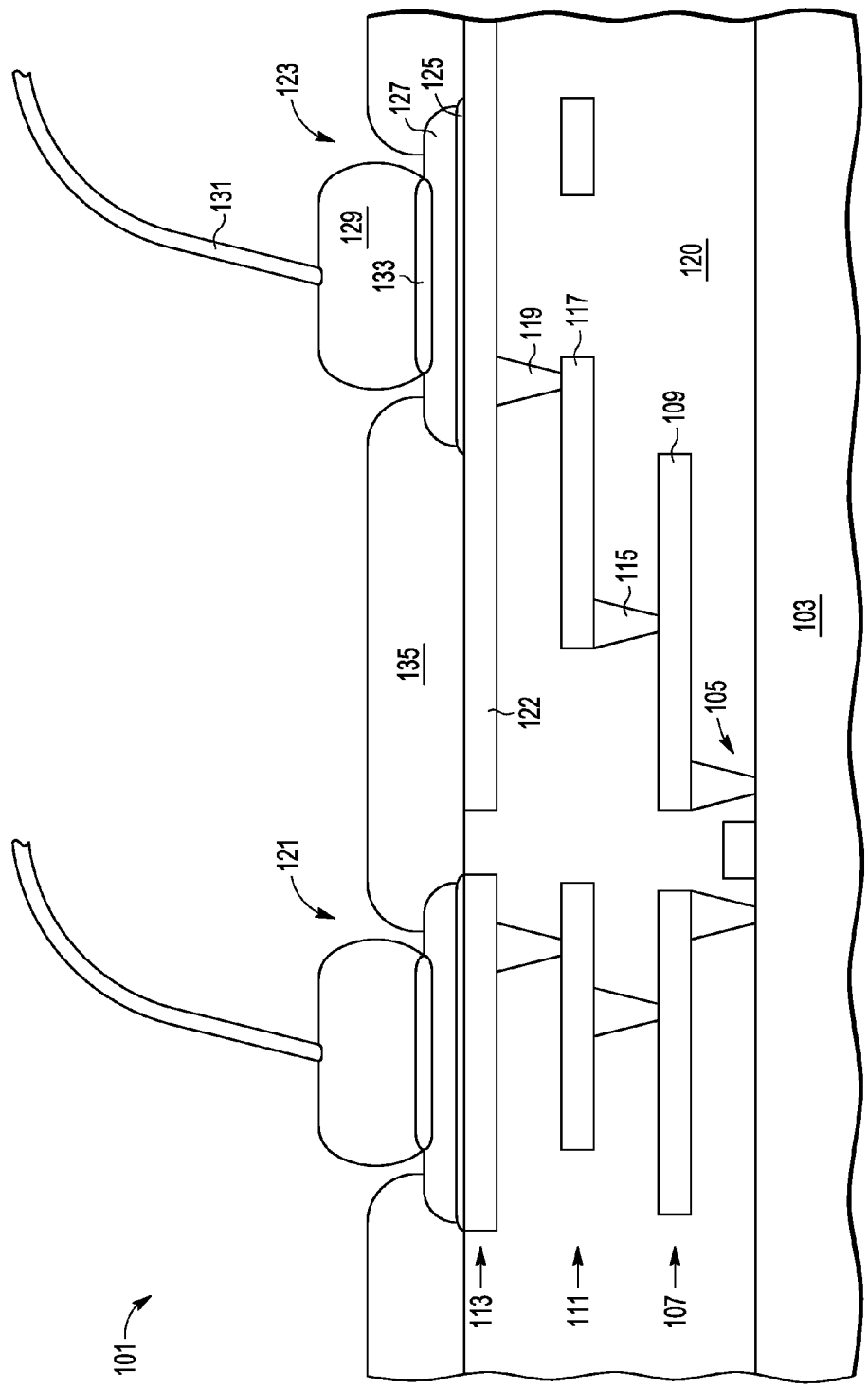
FIGS. 1 and 2 show partial cut away side views of a packaged semiconductor device in various stages of its manufacture according to one embodiment of the present invention.

The following sets forth a detailed description of a mode for carrying out the invention. The description is intended to be illustrative of the invention and should not be taken to be limiting. For example, while HAST testing is used in this description to determine the reliability of packaged semiconductor devices, this is merely illustrative and other forms of accelerated stress testing, such as other biased elevated temperature/humidity tests, are also applicable.

Mold compounds absorb water from the processing environment or end application environment. The water absorbed in the cured mold compound establishes an aqueous environment in the bulk mold compound with a pH that is acidic, neutral, or alkaline. Additionally, the absorption of water into the mold compound leaches and liberates ionic species from mold compound constituents. In presence of moisture some ionic species in the encapsulant, such as chloride ions, form corrosive substances that can attack susceptible metals and intermetallic compounds. In particular, these ionic species can corrode the intermetallic interface between a copper ball bond and an aluminum bond pad on an integrated circuit of the semiconductor device.

Accelerated stress testing is commonly used to determine the reliability of packaged semiconductor devices. Accelerated stress testing includes biased elevated temperature/humidity testing, such as Temperature Humidity Biased (THB) and Highly Accelerated Temperature/Humidity Stress Test (HAST). HAST testing uses a high temperature (e.g., 105-130° C.) and high relative humidity (e.g., 85%), and can also use high atmospheric pressure (e.g., up to 4 atm). The elevated temperature and water absorbed by the mold compound induces conditions intended to find weaknesses in the construction of the device and concealed defects that can cause failure. Failure of a semiconductor device during HAST testing is frequently caused by corrosion due to ionic species in the mold compound that was used to encapsulate the device. Under biasing conditions, this corrosion is even more severe. Thus, even an encapsulated semiconductor device that passes unbiased HAST testing will often fail biased HAST testing. Furthermore, the corrosion becomes more severe as the biasing voltage rises. Thus, an encapsulated semiconductor device that passes biased HAST testing at a low bias voltage (e.g., 3.6V) can fail when biased to a higher voltage.

Bond corrosion due to ionic species in the mold compound frequently causes failure of a semiconductor device. The present invention provides specifications for mold compounds for encapsulating a semiconductor device. These mold compounds are compatible with copper wire bonding because they are specifically optimized to inhibit corrosion of the bond formed between the copper wire and the aluminum bond pad of an integrated circuit. In one example, the mold compound has a specified level of certain ions. In another example, the mold compound has specified pH and chloride ion levels. In yet another example, the mold compound has a specified level of certain ions, and specified pH and chloride ions levels. A mold compound meeting these specifications inhibits corrosion of the copper wire bonds in the encapsulated semiconductor device.

We determined that the majority of the material leached from a mold compound during extraction testing is made up of organic constituents. In one exemplary case, a commonly used mold compound was subjected to extraction testing and it was determined that a majority of the 400 parts per million (ppm) of extracted material comprised organic constituents that leached or dissolved from the mold compound. The main organic constituents in this illustrative case included 1-Hydroxy-1,3-butadiene; Acetaldehyde; Ethanol; 2-Butanone; 4-methyl-2-pentanone; Acetone; and Benzene. The presence of 400 ppm of leached and dissolved material in the aqueous extract is equivalent to 4000 ppm of leached and dissolved material in the bulk mold compound. Such leaching and dissolution of organic compounds from the mold compound results in an increase in dissolved solids in the water absorbed by the bulk mold compound. These non-ionized constituents impede the mobility of anions and cations that are also leached into the absorbed water. A mold compound with the specified level of ions, and/or the specified pH, and/or a specified level of leachable/soluble organic constituents allows a semiconductor device with copper wire bonds that is encapsulated with this mold compound to pass biased HAST testing. Thus, the semiconductor device has a greater probability of long term operational reliability in a final product.

FIG. 1 is a partial cutaway cross-section of a semiconductor device having wires that are wire bonded to conductive bond pads in accordance with one embodiment of the present invention. In this embodiment, the semiconductor device is an integrated circuit 101 that includes multiple transistors and/or other types of semiconductor components (e.g., diodes) fabricated in a semiconductor material (e.g., semiconductor substrate). The illustrated portion of the integrated circuit 101 shows an exemplary transistor 105, which is a CMOS transistor fabricated in a silicon substrate 103. In further embodiments, the integrated circuit includes other types of semiconductor components, is fabricated in other types of semiconductor material, and/or has other configurations. The transistor and other components are not drawn to scale in the figures for ease of understanding.

In the illustrated embodiment, the semiconductor components of the integrated circuit 101 are electrically coupled together by conductive interconnect structures located in one or more interconnect layers. In this embodiment, a conductive interconnect structure 109 of one interconnect layer 107 is coupled to another conductive interconnect structure 117 of another interconnect layer 111 through conductive vias 115 and 119 or through a conductive plug. The conductive interconnect structures and vias are made of a conductive material (e.g., copper, aluminum, or tungsten) and can include diffusions layers and barrier layers. The conductive structures are located in interlayer dielectric material 120 (e.g., an oxide formed by a TEOS process or another type of dielectric material such as a low-k, ultra-low-k, or extremely-low-k material) to isolate the electrically conductive structures. In this embodiment, the conductive interconnect layers and dielectric material layers are alternatingly formed over substrate 103.

Additionally, the integrated circuit 101 of the illustrated embodiment includes wire bond pads 121 and 123 that are formed on interconnect structures (e.g., 122) of the final interconnect layer 113. In this embodiment, the final interconnect layer 113 is made of copper. A diffusion barrier 125 (e.g., tantalum or tantalum nitride) is formed on the copper, and an aluminum bond pad layer 127 is formed on the diffusion barrier 125. A passivation layer 135 made of a dielectric material (e.g., silicon nitride) is formed over the integrated circuit 101 to electrically isolate and protect the integrated circuit 101. Openings are made in the passivation layer 135 to expose the bond pad layers (e.g., 127).

After the formation of passivation layer 135, the wafer on which the integrated circuit 101 is formed is divided into multiple integrated circuits. The integrated circuits are then mounted onto structures such as substrates or lead frames.

After the integrated circuit is mounted unto a substrate or lead frame, wires 131 are attached by a wire bonding process to bond pads 121 and 123 with a wire bonding material (e.g., ball bond 129). During the wire bonding process, a ball is formed on the end of the wire 131 and this ball is connected to an aluminum bond pad layer 127. The ball is deformed during the wire bonding process to form the ball bond 129. The wire 131 and the bonding material (ball bond) 129 form a wire bond. The other end of the wire 131 is attached to a conductive structure of the substrate or lead frame (e.g., via a stitch bond). In the illustrated embodiment, the wire 131 is attached to the bond pad 123 of the integrated circuit 101 with a ball bonding wire bond process. In further embodiments the wires are attached to bond pads by other wire bonding techniques (e.g., stitch bonding or wedge bonding).

In this exemplary embodiment, the conductive ball bonding material of ball bond 129 is copper (e.g., greater than 95% copper) and the pad layer 127 is aluminum (e.g., greater than 95% aluminum). With this structure, the wire bonding process causes a material layer 133 comprised of one or more intermetallic phases of aluminum and copper to be formed at the interface of the pad layer 127 and the bonding material of ball bond 129. After the initial wire bonding process, this intermetallic layer may change in thickness, type or types of intermetallic phases, and in distribution of intermetallic phases, during semiconductor device assembly, testing and use. This multiphase material layer 133 is susceptible to corrosion from corrosive substances in an encapsulant that is subsequently used to package the integrated circuit. The multiphase material layer 133 can be comprised of intermetallic phases that are "copper rich" near its top (i.e., closest to ball bond 129) and "aluminum rich" near its bottom (i.e., closest to aluminum pad layer 127).

In further embodiments, the ball bond 129 and the pad layer 127 are made of other materials (e.g., copper, aluminum, gold, or metal alloys). Additionally, in some embodiments of the present invention, corrosion inhibitors and/or diffusion barrier layers (such as a stack of nickel/palladium/gold) are applied to the pad layer 127 prior to wire bonding.

Figure 2:
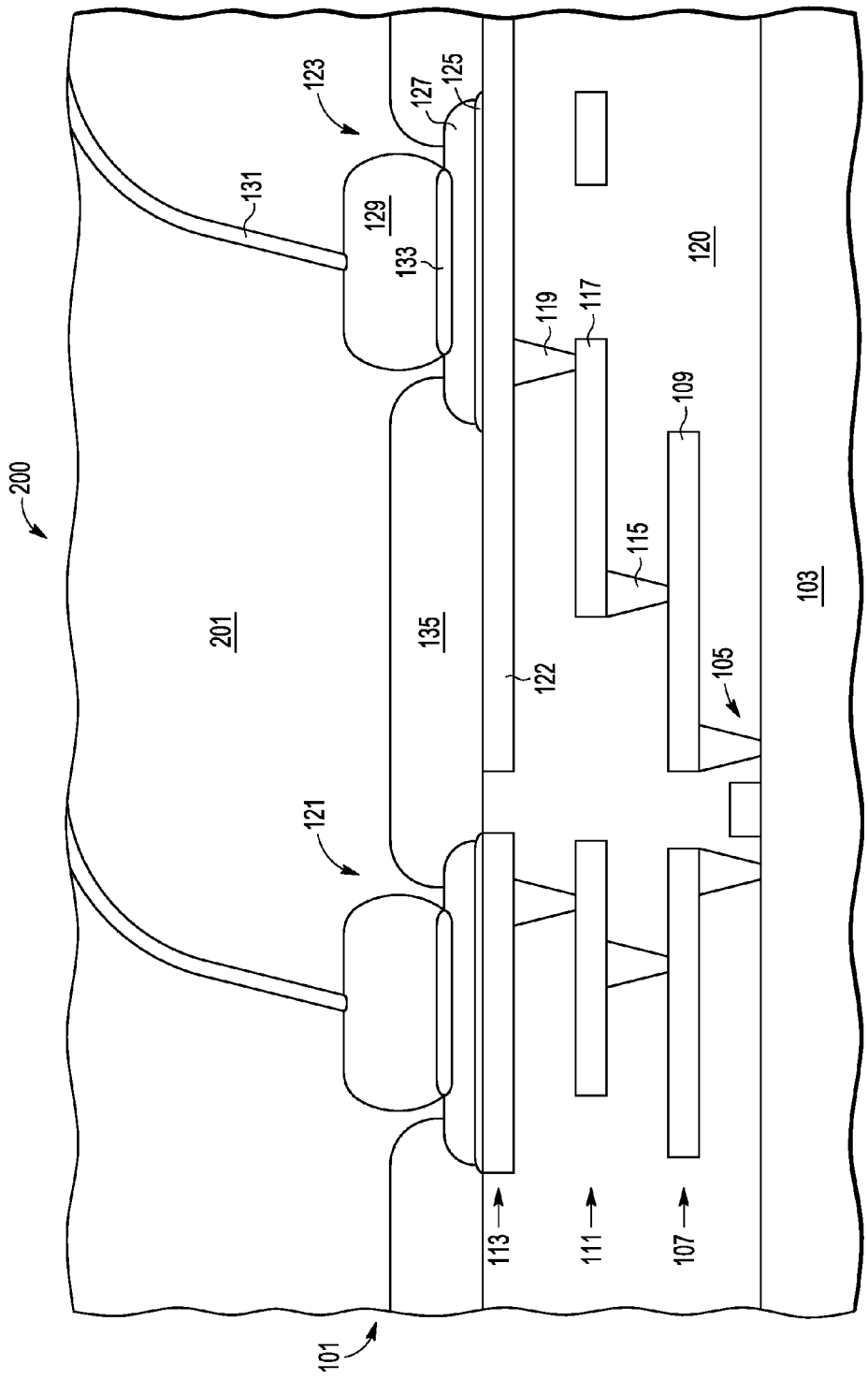

FIG. 2 shows a partial cutaway cross-section of the semiconductor device after encapsulation in accordance with one embodiment of the present invention. In the packaged semiconductor device 200, the integrated circuit 101, the wires 131, and the substrate or lead frame are encapsulated with an encapsulant 201. In this embodiment, the encapsulant 201 is applied to the integrated circuit by a transfer molding process. In further embodiments, the encapsulant is applied by another encapsulating process (e.g., a center gate molding process, a compression molding process, an injection molding process, or application of a liquid encapsulant). The encapsulated packages are typically encapsulated in strips, arrays, panels, or another configuration, and then separated into individual packages.

The encapsulant 201 is formed from a molding compound. In this exemplary embodiment, the molding compound includes silica fillers (e.g., 60-90% by weight), an epoxy resin (e.g., 5-15% by weight), hardeners (e.g., 5-15% by weight), and flame retardants (e.g., less than 2% by weight). The encapsulant 201 can also include other materials such as stress release agents, catalyst accelerators, coupling agents, carbon black, release agents, and coloring agents. In further embodiments, the encapsulant includes different materials, a different combination of materials, and/or has different percentages of the materials. A typical mold compound resin system is comprised of the resin, hardener, catalysts, coupling agents, stress release agents/flexibilizer, mold release agents, and minor additives.

Figure 3:
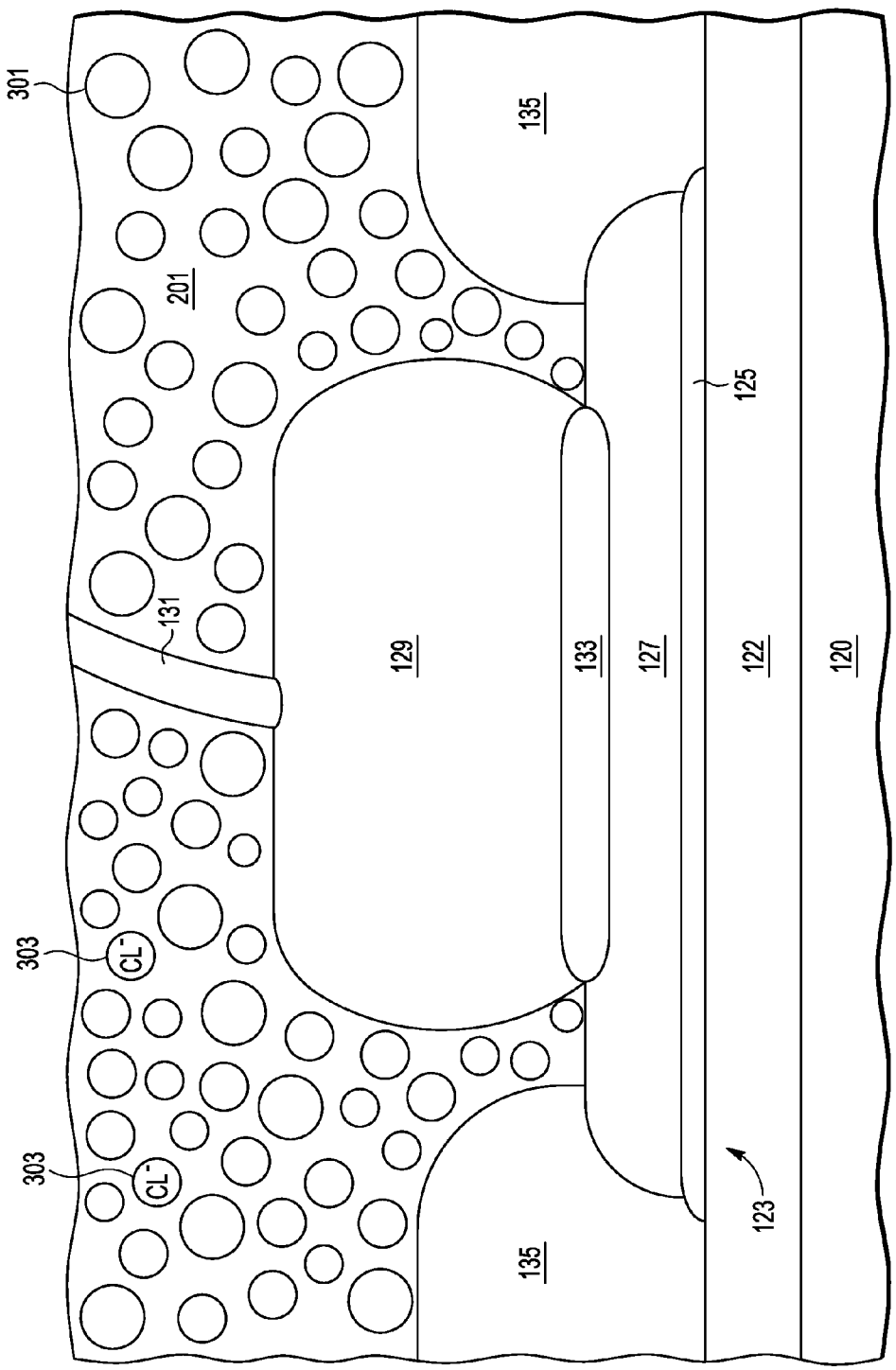
FIG. 3 shows a more detailed view of a portion of the packaged semiconductor device of FIG. 2.

FIG. 3 is a more detailed view of the bond pad 123 of FIG. 2. In the view of FIG. 3, some individual particles located in the encapsulant 201 are shown for illustrative purposes and are not drawn to scale.

As shown, silica particles 301 are distributed throughout the encapsulant 201. Also distributed in the encapsulant 201 are negatively charged chloride ions 303. These chloride ions $Cl^-$ are generated from the different components of the encapsulant. Mold compounds absorb moisture (e.g., moisture content 0.1-0.6%) that along with ionic impurities such as chloride ions form electrolytes that can cause corrosion to metal and intermetallic structures. Susceptibility to corrosion varies from metal to metal and intermetallic phase to intermetallic phase, and is governed by thermodynamic and kinetic principles. For example, chloride ions 303 can cause corrosion in the multiphase material layer 133 because that layer is relatively more susceptible to corrosion than the copper in the copper ball bond 129 and the aluminum in the aluminum pad layer 127. More specifically, among the various structures involved in copper-aluminum wire bonding (wire 131, ball bond 129, multiphase material layer 133, and pad layer 127), copper-aluminum intermetallic compounds (IMC) in the multiphase material layer 133 are easily corroded. Among the various IMC compounds in the multiphase material layer 133, the one closest to the copper ball bond 129 is more susceptible to corrosion, but other IMC phases in multiphase material layer 133 are also susceptible to corrosion under the appropriate conditions. Under aggressive conditions, the chloride ions can also attack metals like aluminum and copper.

During the operation of the integrated circuit, some bond pads (e.g., bond pad 123) are biased at a positive voltage (e.g., 2.2V, 4V, or 5V). An example is a bond pad that supplies the integrated circuit 101 with a positive supply voltage $V_{DD}$. Being biased at a positive voltage, conductive structures that are adjacent to the encapsulant attract the negatively charged ions (such as chloride ions 303) and cause them to migrate toward the positively biased conductive structures. The buildup of chloride ions at the positively biased structures can cause corrosion. For example, chloride ions attracted to a positively biased bond pad 123 and ball bond 129 can cause corrosion of the multiphase material layer 133. Such corrosion can lead to an increased resistance or to a complete open of the bond pad/wire bond connection.

Several techniques have been proposed to inhibit such corrosion by chloride ions and other corrosive substances in the encapsulant. Some proposed techniques modify the copper wire. For example, one proposal dopes the copper wire with a noble metal such as gold or palladium, or coats the copper wire with a noble metal such as gold or palladium, in order to delay corrosion. Another proposed technique adds an antioxidant to the mold compound that forms the encapsulant. Yet another proposed technique adds calcium oxide, magnesium oxide, barium oxide, calcium hydroxide, magnesium hydroxide, or barium hydroxide to the mold compound. Other references describe the corrosive effects of mold compounds that have the wrong pH and that contain the wrong level of leachable chloride. For example, one reference generally shows that, when using a single mold compound and a specific type of copper wire, a higher pH allows higher levels of chloride to be tolerated before failure at a single operating voltage.

Chloride ions and other corrosive ions (e.g., bromide, fluoride, oxylate) in the mold compound cause copper ball bond corrosion. This corrosion has been found to be the main reason for failure during biased HAST testing for semiconductor devices having copper wires. There are many different mold compounds having different compositions, additives, and physical properties. Further, conventional mold compounds have wide specifications that allow the properties of a single mold compound to vary over a wide range for different batches of that mold compound. We have performed extensive work to categorize mold compounds based on physical properties, and have used biased HAST testing to determine reliability of packaged semiconductor devices that utilize these mold compounds. From some general information about the effects of certain properties (such as pH and chloride level) on copper ball bond reliability, our work has allowed us to establish specifications for a mold compound that, despite the presence of chloride ions and other corrosive ions, inhibit copper ball bond corrosion.

We identify specified combinations of narrow ranges of pH and chloride levels for a mold compound, as a function of the operating voltage level, that inhibit copper ball bond corrosion in the packaged semiconductor device. Additionally, we identify specified levels of beneficial ions in a mold compound that inhibit copper ball bond corrosion in the packaged semiconductor device. None of the prior art techniques or references specifies a combination of narrow ranges of pH and chloride levels of a mold compound that inhibit copper ball bond corrosion at different operating (or supply) voltage levels and for long term operation. The prior art techniques and references also fail to specify a level of beneficial ions in a mold compound that inhibit copper ball bond corrosion. Further, the specifications that are identified apply across a broad range of different mold compounds, resin types, hardeners, filler weights, moisture absorption levels, and operating voltage levels. By encapsulating an integrated circuit having copper wire bonds in a mold compound having the specified combinations of ranges of pH and chloride level and/or the specified levels of beneficial ions, the resulting packaged semiconductor device is reliable for long term operation and can pass biased HAST testing over a wide range of operating voltage levels.

As explained above, chloride and other corrosive ions in a mold compound can cause copper ball bond corrosion. However, some ions in the mold compound can be beneficial with regard to copper ball bond corrosion. Exemplary beneficial ions include formate, acetate, carbonate, phosphate, silicate, nitrate, nitrite, and sulfate ions. We have found that the presence of beneficial ions (anions and/or cations) in the mold compound inhibits copper ball bond corrosion when chloride is present in the mold compound. Beneficial ions impede the ability of the chloride ions to attack the copper ball bond. When the mold compound contains a certain total level of beneficial ions, these ions inhibit chloride from affecting the copper ball bond.

We have determined that copper ball bond corrosion is inhibited when total leachable beneficial ions in the mold compound range from 100 ppm to 2000 ppm, depending on the chloride concentration and pH. A higher level of total beneficial ions is desirable when the chloride concentration is high and/or when the pH low. Based on our experimental work and biased HAST testing, a preferred total level of beneficial ions in the mold compound is from 200 ppm to 500 ppm. In one exemplary embodiment, the total leachable ions, from a group of beneficial ions consisting of formate, acetate, phosphate, silicate, nitrate, nitrite, and sulfate, is at least 200 ppm, and preferably not more than 500 ppm. In some embodiments, these specified total levels of ions are used in a molding compound that includes silica fillers (e.g., 60-90% by weight), an epoxy resin (e.g., 5-15% by weight), hardeners (e.g., 5-15% by weight), and flame retardants (e.g., less than 2% by weight).

The specified total level of ions indicates the sum of all leachable beneficial ions in the mold compound. In other words, the total leachable beneficial ion level is determined by summing the level (i.e., ppm) of each beneficial ion in the mold compound. Thus, the specified total level can be reached by both one mold compound that contains only a single beneficial ion (e.g., 50 ppm of leachable acetate ions) and another mold compound that contains a combination of beneficial ions (e.g., 5 ppm of leachable acetate ions, 8 ppm of leachable phosphate ions, and 8 ppm of leachable nitrate ions). Further, in some embodiments the beneficial ions are all anions, while in other embodiments the beneficial ions are cations, or both anions and cations.

We have also determined that higher total levels of beneficial ions increase corrosion resistance. Thus, higher total levels allow higher chloride levels, lower pH, and higher operating voltage levels. Thus, higher total levels provide better performance across a wider range of mold compounds and environments. Table 1 shows the pH and concentrations of a wide range of extracted ions from three commercial semiconductor product mold compounds, expressed in terms of the extracted ion concentration in the bulk mold compound. The ions that have been demonstrated to induce or accelerate corrosion of the copper ball bond intermetallic bond layer are chloride and oxalate. The total content of benign ions in the extracts from mold compounds A, B, and C are 218.1 ppm, 258 ppm, and 611.6 ppm, respectively.

TABLE 1

| Mold Compound | Mold Compound A | Mold Compound B | Mold Compound C |
|---|---|---|---|
| pH | 5.1 | 5.7 | 6.7 |
| Cl— | 6 | 16 | 10 |
| Acetate | 41 | 41 | 167 |
| Formate | 96 | 64 | 217 |
| Nitrite | 1.8 | 26 | 52 |
| Nitrate | | 34 | 19 |
| Phosphate | 39 | 13 | 3.6 |
| Sulfate | 38 | 31 | 23 |
| Oxalate | 0.9 | 2.9 | 11 |
| Magnesium | 2.3 | 49 | 130 |
| Total Benign Ions | 218.1 | 258 | 611.6 |

Additionally, we have found that certain pH levels of the mold compound can inhibit copper ball bond corrosion when a relatively high level of chloride is present in the mold compound. The pH level acts to impede the ability of the chloride ions to attack the copper ball bond or the IMC layer formed between the ball bond and the aluminum pad. When the mold compound has a certain pH level, certain levels of chloride must be present before the copper ball bond is affected.

We have determined that in a mold compound having specific combinations of narrow ranges of pH and chloride levels copper ball bond corrosion is inhibited. When the mold compound has a combination of pH and leachable chloride ion levels that is within these specified ranges, for the applicable operating (or bias) voltage level, the chloride is inhibited from affecting the copper ball bond.

Extensive work was conducted developing mold compounds and performing biased HAST Temperature Humidity Bias (THB) testing, and copper ball bond ball shear testing after immersion in aqueous extracts of powdered mold compounds to identify reliable mold compounds. Table 2 shows the results of testing the corrosion resistance of copper ball bonds in the aqueous extracts from mold compounds A, B, and C (from Table 1) by measuring the strength of the copper ball bonds in shear testing with the ball bonds being pushed off the bond pad with a measurement instrument. The bonds between the copper ball and the aluminum bond pad that had severe, or total, corrosion of the intermetallic bond phase showed ball bond lifting with no measureable ball shear strength. The bonds that were not attacked, or were not corroded as severely, demonstrated resistance to shearing that is reported as the ball shear strength in grams of load required to shear the copper ball bond from the pad. In some cases, the mold compound extract was slightly modified to increase or decrease the pH using an additive demonstrated not to cause any corrosion. In other cases, the mold compound extract was slightly modified to increase the chloride content. Through this testing we determined the ionic environment in mold compounds saturated with moisture and the ability of these environments to cause ball bond corrosion. This allowed us to establish specification limits for pH, ions, and other species dissolved in the mold compound extracts. This testing was correlated with measurements performed on active IC devices in bHAST or THB testing.

TABLE 2

| EMC | pH | Cl (ppm) | Ball Shear Strength (g) |
|---|---|---|---|
| Mold Compound A | 6 | 20 | Ball Bond Lifting |
| | 6.5 | 20 | 23.1 |
| Mold Compound 8 | 5.5 | 16 | 21.07 |
| | | 20 | 24.17 |
| | 6 | 20 | 22.89 |
| | 6.5 | 16 | 22.62 |
| | | 20 | 22.53 |
| | 5 | 50 | Ball Bond Lifting |
| Mold Compound C | 4.5 | 53 | 20.1 |
| | 6 | 20 | 24.17 |
| | 5 | 50 | 22.9 |

Mold Compound Extract Modifications

Table 3 shows the results of testing mold compound A with the pH and chloride content varied extensively.

TABLE 3

| EMC | pH | Cl, ppm | Ball Shear Strength, g |
|---|---|---|---|
| Mold Compound A Extract Modifications | 4 | 4.4 | 14.33 |
| | 4.5 | 4.1 | 22.81 |
| | | 6.0 | 21.14 |
| | 5 (Actual Extract) | 10 (Actual Extract) | 23.77 |
| | | 20 | Ball Bond Lifting |
| | | 5.4 | 22.39 |
| | 5.5 | 10 | 24.2 |
| | | 20 | Ball Bond Lifting |
| | | 10 | 24.79 |
| | 6 | 15 | 23.87 |
| | | 20 | Ball Bond Lifting |
| | | 6.0 | 21.5 |
| | 6.5 | 10 | 24.6 |
| | | 20 | 23.1 |
| | | 3.7 | 20.22 |
| | 7.5 | 10 | 24.28 |
| | | 20 | 25.99 |
| | 8 | 5.2 | 23.34 |

Tables 4 and 5 shows the results of testing to determine the effect of organic ion levels in the mold compound extracts. The solutions used for the corrosion studies were synthetic versions of mold compound extracts that were formulated with ultra-pure water and controlled amounts of the desired additives. The ultra-pure water pH was equilibrated by allowing the water to quickly saturate with absorbed carbon dioxide from the ambient atmosphere, so that a stable, mildly acidic pH of 5.75 was consistently achieved. The humidity of ambient air is expected to similarly bring dissolved carbon dioxide into the mold compound encapsulating an IC device. In the testing of Tables 4 and 5, the levels of chloride were varied from 0 to 100 ppm, and the levels of the other ions were varied from 0 to 2000 ppm. The benefit of the selected ions in impeding copper ball bond corrosion is demonstrated by the impact on the reported bond shear strength. The impact of time of immersion on the corrosion of the copper ball bonds was also determined. Similar testing demonstrated the negative effect of oxalate ions on the copper ball bond corrosion.

TABLE 4

| | Solution Chemistry | | Ball | | |
|---|---|---|---|---|---|
| pH | Ion Type | Bulk EMC (ppm) | Immersion Time (hrs) | Shear Strength (g) | Comments |
| 5.75 | UPW | N/A | 168 | 21.81 | No ball bond lifting |
| 5.75 | UPW + Cl— | 10 | 95 | / | Ball bond lifting |
| 5.06 | Formate | 100 | 96 | 21.47 | No ball bond lifting |
| | Acetate | 50 | 168 | 21.87 | No ball bond lifting |
| | Cl— | 10 | | | |
| 4.10/ | Formate | 100 | 96 | / | Ball bond lifting |
| 3.92 | Acetate | 50 | | | |
| | Cl— | 10 | | | |
| 4.96 | Formate | 100 | 96 | / | Ball bond lifting |
| | Acetate | 50 | | | |
| | Cl— | 10 | | | |
| 6.09 | Formate | 100 | 96 | 21.26 | No ball bond lifting |
| | Cl— | 10 | | | |
| 6.14 | Formate | 150 | 96 | 24.02 | No ball bond lifting |
| | Cl— | 15 | | | |
| 6.09 | Acetate | 150 | 96 | 21.23 | No ball bond lifting |
| | Cl— | 15 | | | |
| 5.13 | Formate | 150 | 96 | / | Ball bond lifting |
| | Cl— | 15 | | | |
| 5.06 | Acetate | 150 | 96 | / | Ball bond lifting |
| | Cl— | 15 | | | |

TABLE 5

| | Solution Chemistry | | | Ball Shear | |
|---|---|---|---|---|---|
| pH | Ion Type | Bulk EMC (ppm) | Immersion Time (hrs) | Strength (g) | Comments |
| 6.48 | Acetate | 500 | 24 | / | Ball bond lifting |
| | Cl— | 100 | | | |
| 6.76 | Acetate | 2000 | 96 | 20.89 | No ball bond lifting |
| | Cl— | 100 | | | |
| 6.14 | Formate | 500 | 24 | / | Ball bond lifting |
| | Cl— | 100 | | | |
| 6.33 | Formate | 2000 | 96 | 21.81 | No ball bond lifting |
| | Cl— | 100 | | | |
| 6.41 | Formate | 1000 | 96 | 18.77 | No ball bond lifting |
| | Acetate | 1000 | | | |
| | Cl— | 100 | | | |
| 5.83 | Nitrite | 500 | 24 | / | Ball bond lifting |
| | Cl— | 100 | | | |
| 6.10 | Nitrite | 1750 | 96 | 21.89 | No ball bond lifting |
| | Cl— | 100 | | | |

The testing reported in Tables 1-5 allowed the development of mold compounds that are acceptable for use with IC devices operating over a wide range of voltages.

We have identified combinations of narrow ranges of pH and total leachable chloride ion levels of a mold compound that inhibit copper ball bond corrosion at specific operating voltage levels, as shown in Table 6.

TABLE 6

| pH | chloride (ppm) |
|---|---|
| A) Operating Voltage: 6 V or less | |
| at least 5.0 | at most 10 |
| at least 5.5 | at most 15 |
| at least 6.5 | at most 20 |

TABLE 6-continued

| pH | chloride (ppm) |
|---|---|
| B) Operating Voltage: 65 V or less | |
| at least 6.0 | at most 5 |
| at least 7.0 | at most 15 |
| C) Operating Voltage: Unspecified | |
| 6.5-7.5 | at most 20 |

With respect to these chloride ion levels and the total levels of ions specified above, "ppm" identifies parts per million in the mold compound as determined from a sample of the mold compound using the equation: $A = B \times (C/W)$, where A is the concentration (ppm) of the element, B is the solution concentration obtained from an Ion Chromatography (IC) test (ppm), C is the quantity of distilled water used in the test (e.g., 50 ml), and W is the quantity of the sample (e.g., 5 g).

These specified combinations of narrow ranges of pH and chloride levels are applicable to a wide range of mold compounds. Because copper and aluminum are known to be susceptible to corrosion under alkaline conditions, it is not desirable to have a pH greater than 8. For example, they can be used to form a new narrow specification for an existing mold compound or they can be used to reformulate a mold compound to achieve the specified combinations of pH and chloride levels. Further, the specified combinations of pH and chloride levels are applicable to many mold compound resin and hardener systems. For example, they are known to apply to OCN (ortho cresol novolac), biphenyl, MAR (multi-aromatic resin), and LMWE (low molecular weight epoxy) resin types, and blends thereof, and should also apply to other resin types. Similarly, they are known to apply to MAR, PN (phenol novolac), and LWAH (low water absorption hardener) hardener systems, and a combination thereof, and should also apply to other hardener types. In one embodiment, the specified combinations of ranges of pH and chloride levels are used with a molding compound that includes silica fillers (e.g., 60-90% by weight), an epoxy resin (e.g., 5-15% by weight), hardeners (e.g., 5-15% by weight), and flame retardants (e.g., less than 2% by weight).

The specified combinations of narrow ranges of pH and chloride levels include a combination that inhibits corrosion and passes biased HAST testing over a wide range of operating voltage levels. Additionally, the specified combinations include other combinations with different pH and chloride levels that inhibit corrosion and pass biased HAST testing with limited operating voltage levels. These combinations show that a pH that is unacceptable for a wide range of voltages can be acceptable with limited operating voltages if the chloride level is low.

Table 7 shows an example of our testing. These are mold compounds that are commonly used in semiconductor device packaging. Table 2 illustrates the impact of different pH and chloride levels of these mold compounds on copper ball bond corrosion using the ball shear immersion test, which is known to correlate with biased HAST testing.

TABLE 7

| pH | chloride (ppm) | Ball Shear Strength (g) |
|---|---|---|
| A) Mold Compound A | | |
| 6 | 2 | ball bond lifting |
| 6.5 | 2 | 23.1 |

TABLE 7-continued

| pH | chloride (ppm) | Ball Shear Strength (g) |
|---|---|---|
| B) Mold Compound B | | |
| 5.5 | 1.57 | 21.07 |
| 5.5 | 2 | 24.17 |
| 6 | 2 | 22.89 |
| 6.5 | 1.57 | 22.62 |
| 6.5 | 2 | 22.53 |
| 5 | 5 | ball bond lifting |
| C) Mold Compound C | | |
| 4.5 | 0.85 | 20.10 |
| 6 | 2 | 24.17 |
| 5 | 5 | 22.90 |

In addition to our findings with respect to total beneficial ion levels and combinations of narrow ranges of pH and chloride levels, we have found other attributes that increase the reliability of mold compounds. These attributes can be combined with one or both of the specifications for ion levels and pH and chloride levels described above.

We have determined that it is beneficial for a mold compound to have a moisture absorption level that does not exceed 0.5% (by weight). And preferably, the mold compound has a moisture absorption level that does not exceed 0.3% (by weight). For example, our testing showed that the specified combinations of narrow ranges of pH and chloride levels are applicable to mold compounds with moisture absorptions levels from 0.10% to 0.40% (by weight). The moisture weight gain was determined by a Pressure Cooker Test (PCT) at 121° C. and 100% relative humidity for 20 hours.

We have also determined that it is beneficial for a mold compound to have an average particle size of not more than 25 μm, and maximum particle size of not more than 75 μm. Additionally, we have determined that it is beneficial for a mold compound to contain fused silica filler with a filler level of from 82% to 92% (by weight). Our testing showed that the specified combinations of narrow ranges of pH and chloride levels are applicable to mold compounds with substantially spherical fused silica filler at levels of from 84% to 90% (by weight). However, in general the specifications with respect to total beneficial ion levels and combinations of narrow ranges of pH and chloride levels apply to mold compounds having spherical and non-spherical crushed fused silica fillers, and other types of fillers (e.g., alumina, boron nitride, and aluminum nitride).

Further, we have found that the oxalate ion aggravates copper to aluminum bond corrosion. We also have determined that it is preferred that the mold compound has an extractable magnesium ion ($Mg^{2+}$) level of 2 ppm to 200 ppm. Additionally, we have determined that it is preferred that the mold compound have an ion catcher (i.e., ion scavengers and ion getters) level of from 0.04% to 0.70% by weight, and that higher ion catcher levels allow higher chloride levels, lower pH, and higher operating voltage levels.

Accordingly, embodiments of the present invention provide specifications for mold compounds for encapsulating a semiconductor device. These mold compounds are compatible with copper wire bonding because they are specifically optimized to inhibit corrosion of the bond formed between the copper wire and the aluminum bond pad of an integrated circuit. In one example, the mold compound has a specified total level of beneficial ions. In another example, the mold compound has a specified combination of pH and chloride ion levels, as a function of voltage. A mold compound meeting these critical parameter levels minimizes, or at least reduces, the ability of chloride to corrode the copper to aluminum bond pad interface in the encapsulated semiconductor device. Thus, a semiconductor device with copper wire bonds that is encapsulated with the mold compound has reduced corrosion under moisture stress conditions and can pass biased HAST testing.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

The Detailed Description section, and not the Abstract section, is intended to be used to interpret the claims. The Abstract section may set forth one or more but not all embodiments of the invention, and the Abstract section is not intended to limit the invention or the claims in any way.

Although the invention is described herein with reference to specific embodiments, various modifications and changes can be made without departing from the scope of the present invention as set forth in the claims below.

What is claimed is:

1. A mold compound for encapsulating an electronic device, the mold compound comprising:
   silica fillers;
   epoxy resin system; and
   beneficial ions that are beneficial with respect to copper ball bond corrosion,
   wherein a total level of the beneficial ions in the mold compound is at least approximately 500 ppm, and
   the beneficial ions are ions selected from the group consisting of formate $(HCOO)^-$, acetate $(CH_3CO_2)^-$, and nitrite $(NO_2)^-$.

2. The mold compound of claim 1, wherein the total level of the beneficial ions in the mold compound is less than or equal to approximately 2000 ppm.

3. The mold compound of claim 1, wherein the total level of the beneficial ions in the mold compound is over 600 ppm.

4. The mold compound of claim 3, wherein the total level of the beneficial ions in the mold compound is less than or equal to approximately 2000 ppm.

5. The mold compound of claim 1, wherein the beneficial ions are a combination of formate $(HCOO)^-$ and acetate $(CH_3CO_2)^-$ ions.

6. The mold compound of claim 5, wherein the total level of the beneficial ions in the mold compound is less than or equal to approximately 2000 ppm.

7. The mold compound of claim 1, wherein the beneficial ions are nitrite $(NO_2)^-$ ions.

8. The mold compound of claim 1,
   wherein a pH level of the mold compound is 6.0-8.0,
   a level of chloride ions in the mold compound is less than or equal to 5 ppm, and
   an operating voltage level of the electronic device is less than or equal to 65V.

9. The mold compound of claim 1, wherein at least one of:
   a moisture absorption level of the mold compound is less than 0.3% by weight, an oxalate ion level of the mold compound is less than or equal to 50 ppm, and a magnesium ion level of the mold compound is at least 200 ppm.

10. A semiconductor device package comprising:
an electronic device that includes an aluminum bond pad;
a copper wire bonded to the aluminum bond pad; and
an encapsulant, the electronic device and the copper wire being encapsulated by the encapsulant,
wherein the encapsulant comprises:
   epoxy resin system, and
   beneficial ions that are beneficial with respect to copper ball bond corrosion, a total level of the beneficial ions in the encapsulant being less than or equal to approximately 2000 ppm.

11. The semiconductor device package of claim 10, wherein the total level of the beneficial ions in the encapsulant is at least approximately 500 ppm.

12. The semiconductor device package of claim 10, wherein the beneficial ions are ions selected from the group consisting of formate, acetate, carbonate, and nitrite.

13. The semiconductor device package of claim 12, wherein the total level of the beneficial ions in the encapsulant is at least approximately 500 ppm.

14. The semiconductor device package of claim 12, wherein the beneficial ions are a combination of formate $(HCOO)^-$ and acetate $(CH_3CO_2)^-$ ions.

15. The semiconductor device package of claim 12, wherein the beneficial ions are nitrite $(NO_2)^-$ ions.

16. A mold compound for encapsulating an electronic device, the mold compound comprising:

silica fillers;
epoxy resin system; and
beneficial ions that are beneficial with respect to copper ball bond corrosion,
wherein a total level of the beneficial ions in the mold compound is at least approximately 200 ppm, and
the beneficial ions are ions selected from the group consisting of phosphate $(PO_4)^{3-}$ and nitrite $(NO_2)^-$.

17. The mold compound of claim 16, wherein the total level of phosphate $(PO_4)^{3-}$ ions in the mold compound is at least approximately 200 ppm.

18. The mold compound of claim 16, wherein the total level of nitrite $(NO_2)^-$ ions in the mold compound is at least approximately 200 ppm.

19. The mold compound of claim 16,
wherein a pH level of the mold compound is 6.0-8.0,
a level of chloride ions in the mold compound is less than or equal to 5 ppm, and
an operating voltage level of the electronic device is less than or equal to 65V.

20. The mold compound of claim 16, wherein at least one of:
a moisture absorption level of the mold compound is less than 0.3% by weight,
an oxalate ion level of the mold compound is less than or equal to 50 ppm, and
a magnesium ion level of the mold compound is at least 200 ppm.

* * * * *